United States Patent
Lakin et al.

[11] Patent Number: 6,114,635
[45] Date of Patent: *Sep. 5, 2000

[54] CHIP-SCALE ELECTRONIC COMPONENT PACKAGE

[75] Inventors: Kenneth Meade Lakin, Redmond; Ralph Edward Rose; Kevin Thomas McCarron, both of Bend, all of Oreg.

[73] Assignee: TFR Technologies, Inc., Bend, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 09/115,131

[22] Filed: Jul. 14, 1998

[51] Int. Cl.⁷ ...................................................... H05K 1/16
[52] U.S. Cl. ........................... 174/260; 361/752; 361/753
[58] Field of Search ..................... 174/260, 255; 361/753, 758, 752, 799, 800, 796; 257/684, 728, 691, 704

[56] References Cited

U.S. PATENT DOCUMENTS

| | | | |
|---|---|---|---|
| 4,905,075 | 2/1990 | Temple et al. | 357/74 |
| 4,914,741 | 4/1990 | Brown et al. | 357/74 |
| 4,972,253 | 11/1990 | Palino et al. | 357/74 |
| 5,023,398 | 6/1991 | Mahulikar et al. | 174/52.4 |
| 5,099,392 | 3/1992 | Miller et al. | 361/400 |
| 5,418,329 | 5/1995 | Katoh et al. | 174/52.3 |
| 5,745,986 | 5/1998 | Variot et al. | 29/840 |
| 5,808,872 | 9/1998 | Ozawa | 361/760 |
| 5,827,999 | 10/1998 | McMillan et al. | 174/52.4 |
| 5,950,073 | 9/1999 | Griffin, IV et al. | 438/119 |

*Primary Examiner*—Jeffrey Gaffin
*Assistant Examiner*—Jeremy Norris
*Attorney, Agent, or Firm*—G. Joseph Buck

[57] ABSTRACT

A chip-scale sized package for acoustic wave devices, acoustic resonators and similar acoustic devices located upon, or fabricated upon, or as part of, a die. The package includes a lid that is bonded to the die by a strip of solder or other bonding material so as to leave a space between the lid and that portion of the die that acoustically deforms or vibrates. The upper surface of the lid includes electrical connectors that are electrically connected via plated through holes or other means to electrical connectors, or pads on the lower surface of the lid, which pads, in turn, are electrically connected by solder or other electrically conducting material to electrical connectors to the device that are located upon the surface of the die.

12 Claims, 3 Drawing Sheets

FIG. 1

CHIP-SCALE ELECTRONIC COMPONENT PACKAGE

The invention described herein was made under or in the course of a contract with the U.S. Government.

BACKGROUND OF THE INVENTION

1. Field of the Invention

This invention pertains to the packaging of electronic components and devices such as integrated circuit chips within chip-scale sized packages. More particularly this invention pertains to the packaging of acoustic wave devices and related components.

2. Description of the Prior Art

The development of very small electronic components and devices such as semi-conductor integrated circuits has given rise to the need for packages adapted for use with such small components and devices. Such packages typically must hold in place and contain such components and protect the components from harm from the environment, e.g. damage from mechanical contact, harmful electrical contact, and contact with harmful liquids and gases. The packages also usually must provide electrical connections to the components within the packages. Devices for high frequency operation must also be packaged such that the electrical connections to the device do not introduce detrimental parasitic effects.

A widely used, prior art package consists simply of the encapsulation of the integrated circuit chip, or die, within a plastic block of material, e.g. the ubiquitous rectangular solid block of plastic (dual in-line package "DIP") that has 14 or more external pins located along two sides of the block and contains a chip holding from 256 thousand to 256 million bits of random access memory. Typically, the integrated circuit chip is placed upon a lead frame and bond wires are connected between the chip and the lead frame. The chip and lead frame are then encapsulated in plastic. An alternate method of packaging is to place the die into a package having existing walls, sides and leads, connecting bond wires between the die and package lead pads and then attaching a lid to the package. Such packages, however, are unsuitable for use at microwave frequencies because the wire bond lead lengths give rise to excessive inductances and other parasitic effects that degrade device performance.

Surface acoustic wave devices and related devices such as thin film bulk-wave resonators have been developed for use with integrated circuit devices. The dice upon which these surface acoustic wave devices and resonators are fabricated typically are "chip-scale" in size, having dimensions of the order of a few millimeters in length and width and thicknesses of the order of one-quarter of a millimeter. Such chip-scale devices, however, cannot be packaged using the encapsulation technique described above, because the portion of the surface of the die that supports acoustic waves or the portion of the die that acts as an acoustic resonator must be free to deform or vibrate. If such acoustic devices were encapsulated, the portion of the die that supported the acoustic waves or that supported acoustic deformations or vibrations would be unable to deform or vibrate and the device would then be inoperable.

In a paper titled "A New All Quartz Package for SAW Devices", in the 39th Annual Frequency Control Symposium—1985, p. 519, Parker, Callerame and Montress disclose a package for a surface acoustic wave ("SAW") device that utilizes a quartz lid placed upon top of the substrate that contains the device, which lid is bonded to the substrate using a glass frit that provides a hermetic seal and offsets the lid from the acoustically active surface of the substrate. The electrical connections to the acoustic device, however are made via conductors located on the substrate that pass through, or under the glass frit. The quartz lid does not include electrical connections to the acoustic device. As a consequence, the packaging device described by Parker et al, is not adapted for surface mounting to a printed circuit board.

SUMMARY OF THE INVENTION

The present invention is a compact package for such chip-scale acoustic wave and resonator devices, which package protects the device from damage, provides electrical connections to the device and provides a space within which the portion of the die that supports acoustic waves or acoustically deforms or vibrates is free to acoustically deform or vibrate. The present invention utilizes the die, upon which the acoustic device is fabricated, as part of the package.

DETAILED DESCRIPTION

Figure 1:
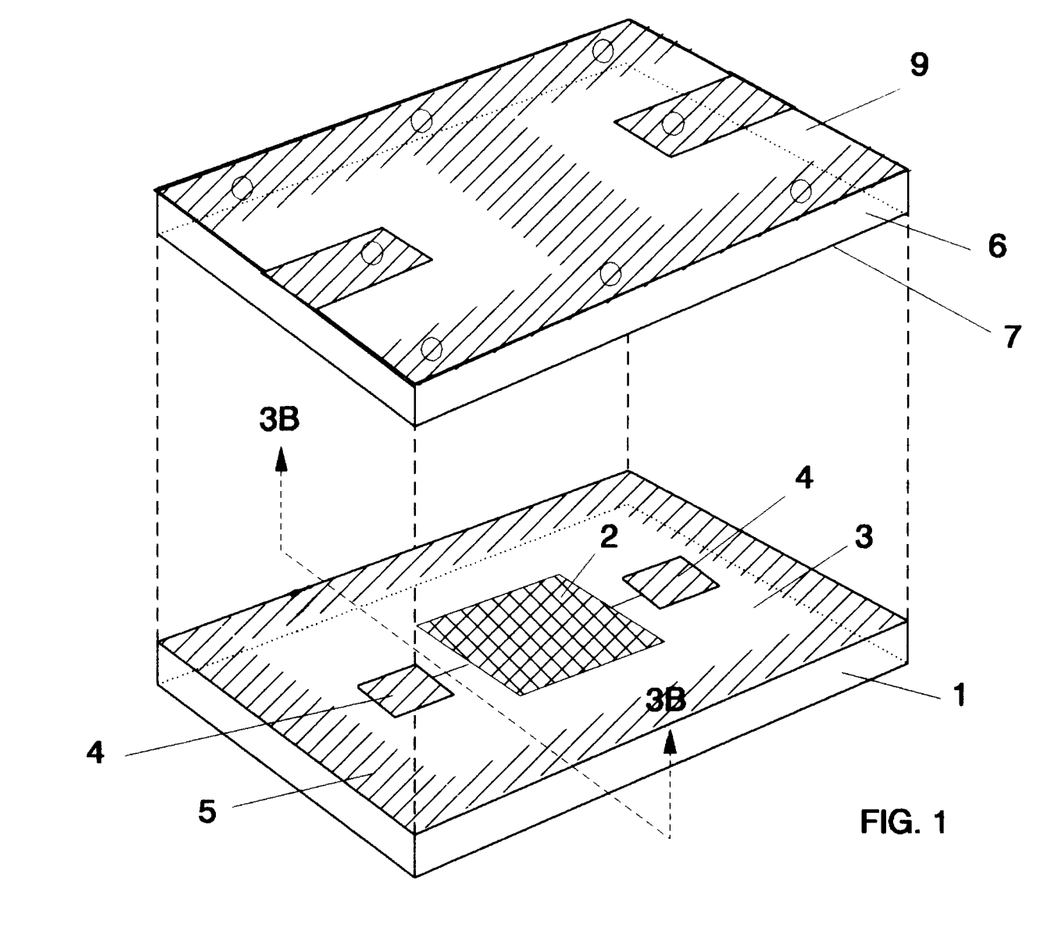
FIG. 1 is an exploded, pictorial view of the preferred embodiment of the invention.

Referring to FIG. 1, a chip, or die 1 of alumina, sapphire or other suitable material, includes at its upper surface 3 an acoustic surface wave device, resonator, or other acoustic device 2. Typically a large number of acoustic devices are fabricated at one time on a single wafer of sapphire or other suitable material by etching away portions of the wafer and/or depositing successive layers of material upon the wafer and then etching away portions of the deposited materials. The wafer is then cut into individual dice, each die containing one or more acoustic devices. Each die typically may have a length and width of the order of 1 to 5 millimeters and a thickness of the order of one-quarter to one-half of a millimeter.

Die 1 typically will include one or more electrical signal connectors pads 4 on its upper surface 3 for the input and output of electrical signals to device 2. In the preferred embodiment, die I includes a bonding strip 5, which is an electrically conducting strip on the upper surface 3 of die 1 that surrounds acoustic device 2. In the preferred embodiment, bonding strip 5 operates as an electrical ground and a counterpoise for the input and output of electrical signals to and from electrical signal connector pads 4.

As depicted in FIG. 1, the preferred embodiment of this invention includes a lid 6 made of alumina, sapphire or other suitable material having a length and width substantially similar to the length and width of die 1 and having a thickness typically of the order of one-quarter of a millimeter. As depicted in FIG. 1 and in FIG. 2C, in the preferred embodiment, lid 6 includes on its lower surface 7 an electrically conducting bonding strip 8 that is similar in shape and position to bonding strip 5 on die 1.

Figure 3A:
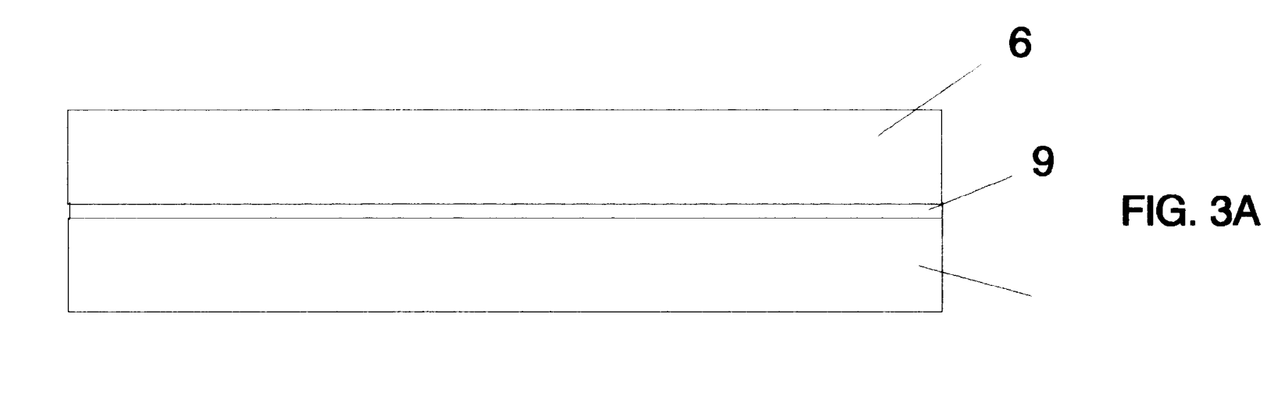
FIG. 3A is a front view of the referred embodiment showing the lid attached to the die and FIG. 3B is a cross-sectional, front view of the invention.
Figure 3B:
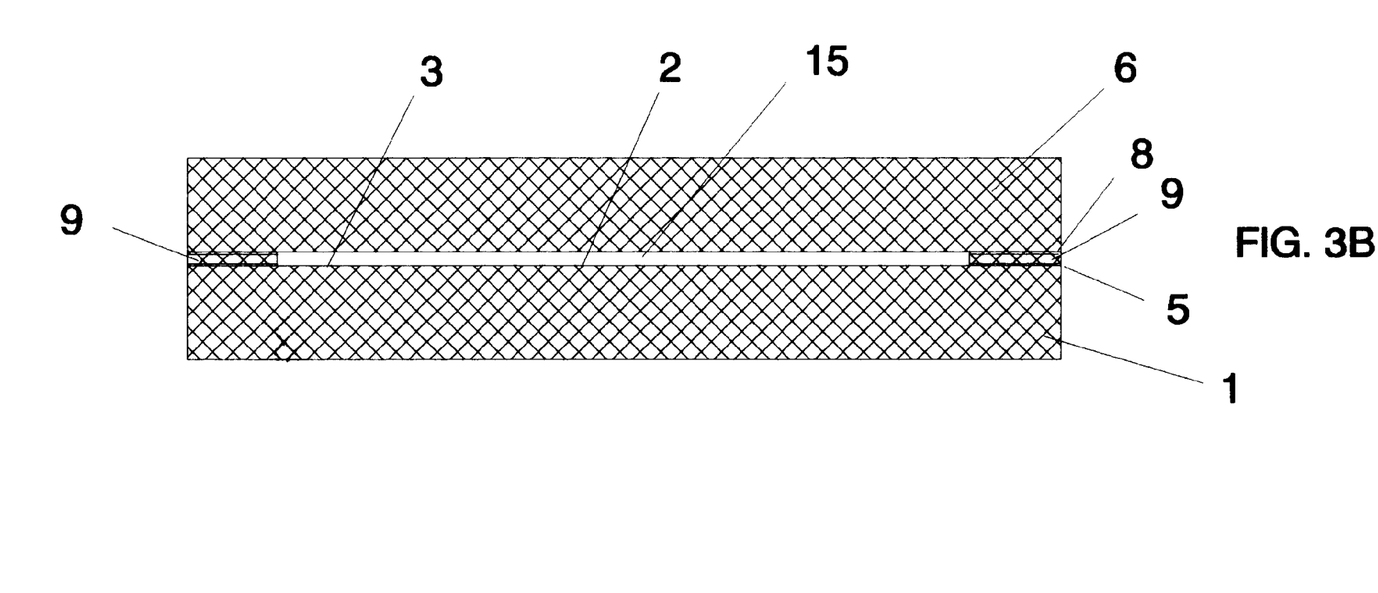

In FIG. 1, lid 6 is depicted in an "exploded" position relative to die 1. As shown in FIG. 3A and FIG. 3B, lid 6 actually is adjacent to and bonded to die 1. Referring to FIGS. 3A and 3B, bonding strip 5 on die 1 and bonding strip 8 on lid 6 are joined together in the package of this invention by a thin layer of bonding material 9. In the preferred embodiment, the bonding material is a gold/tin alloy having a melting point of approximately 280 degrees. The alloy is electrically conductive and electrically connects bonding strip 5 to bonding strip 8. In the preferred embodiment, bonding strips 5 and 8 completely surround device 2 and the bonding together of these two strips hermetically seals device 2 from the environment. The thickness of the thin layer of bonding material 9, together with the thicknesses of bonding strip 5 and bonding strip 8, provide sufficient free space 15 above surface 3 of die 1 such that the portions of device 2 that deform acoustically or vibrate do not contact lid 6 and are free to deform acoustically or to vibrate as required for the proper operation of the device.

Figures 2A, 2B:
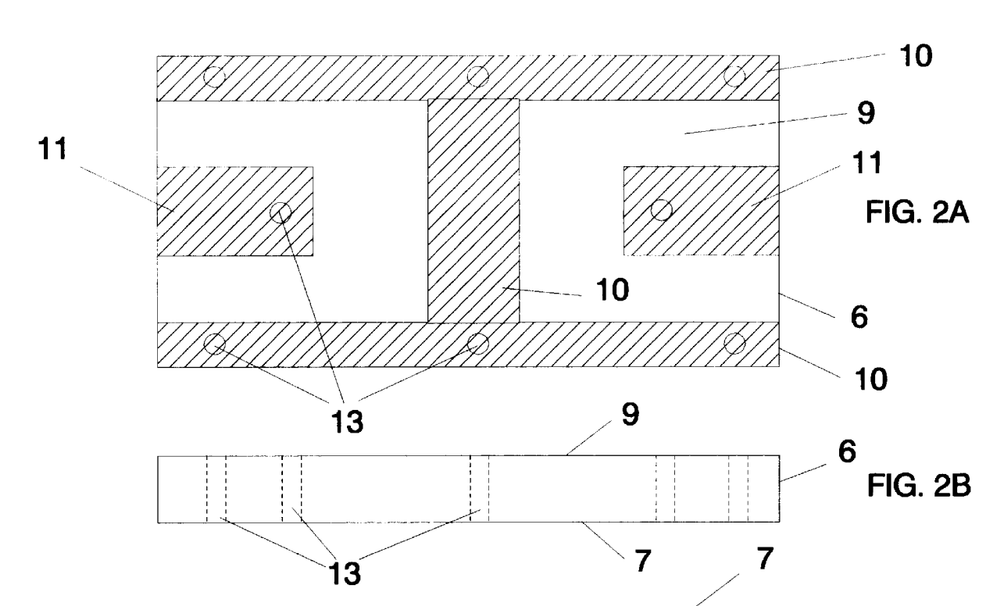
FIGS. 2A, 2B and 2C are respectively top, front and bottom views of the lid portion of this invention.
Figure 2C:
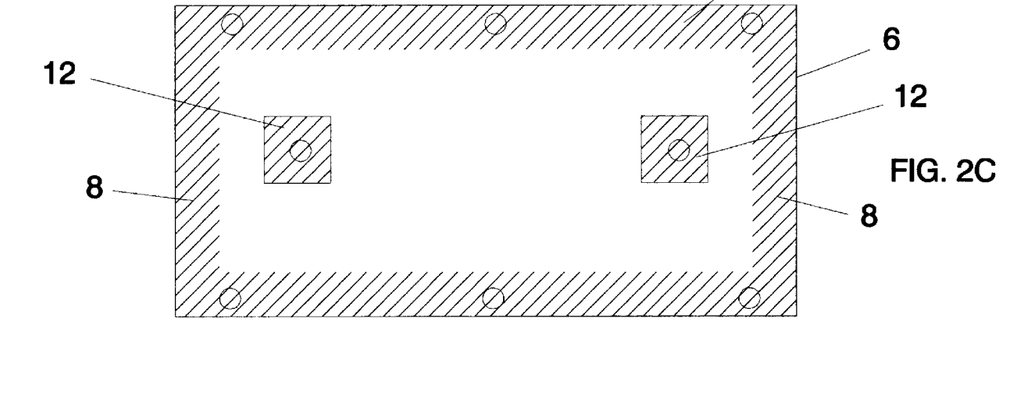

Referring to FIGS. 2A, 2B, and 2C, in the preferred embodiment, lid 6 includes on its upper surface 9, an electrical conducting strip 10 and includes electrically conducting pads that form upper surface signal connector pads 11 that provide electrical connections for the input of signals to and the output of signals from the device contained within the package of this invention. Lid 6 includes on its lower surface 7 electrically conducting signal connector pads that are located under the upper surface signal connector pads 11 and that form lower surface signal connector pads 12. Lid 6 includes holes 13 passing from its upper surface 9 to its bottom surface 7. Lasers or other means may be used to fabricate the holes. Holes 13 are either lined or filled with an electrically conductive material so as to connect electrically conducting strip 10 to strip 8 and to connect electrically the upper surface signal connector pads 11 to the respective lower surface signal connector pads 12. The entire package of this invention may then be attached, lid side down, to a printed circuit by inverting the package and soldering conducting strips 10 and upper input and output connectors 11 onto the printed circuit board so as to bond and connect the package physically and electrically to the printed circuit board.

Instead of soldering the entire areas of bonding strip 10 and signal connector pads 11 to the printed circuit board, a grid of high temperature solder balls may be used to attach, and electrically connect, the package to the printed circuit board.

It should be understood that although strips 10 and strips 5 and 8 have been described as conducting, in other embodiments where a ground or counterpoise for the balanced or unbalance input and output of electrical signals to and from the device is provided by other electrical connections to device 2, bonding strip 5 need not, in fact, be used as a signal ground or counterpoise, but, instead, may be used simply to provide a surface to which lid 6 is bonded. Similarly, bonding strips 8 and 10 need not be conductors, and need not be grounded.

Although in the preferred embodiment the bonding together of strip 5 and strip 8 hermetically seals the device, in instances where the device need not be hermetically sealed, strip 5 and strip 8 need not completely encompass, nor hermetically seal, the device.

Furthermore, although the preferred embodiment includes connectors for both the input and output of electrical signals from the electronic device, this invention can be used as a package for a single port device.

It should also be understood that the package of this invention can be used to package an acoustic wave device which has active acoustic regions on both the upper and lower surfaces of the die on which, or in which, the device is fabricated, simply by attaching a first lid to the upper surface of the die the in the manner of this invention, and attaching a second lid to the lower surface of the die in the same manner.

We claim:

1. A chip-scale package for an electronic device of the type having an acoustically active portion comprising:

a die having an upper surface and having the electronic device located at the upper surface of the die and having a plurality of signal connector pads located upon the upper surface of the die and having a bonding strip located upon the upper surface of the die, a lid made of a substantially non-conducting material and having a lower surface and an upper surface and having a lower surface bonding strip and a plurality of lower surface signal connector pads located upon the lower surface of the lid and having a plurality of upper surface signal connector pads located upon the upper surface of the lid, each upper surface signal connector pad being electrically connected to one of the lower surface signal connector pads, each lower surface signal connector pad on the lid being directly electrically connected to one of the signal connector pads located upon the upper surface of the die, the bonding strip located upon the upper surface of the die being bonded by a bonding material to the bonding strip located upon the lower surface of the lid, the lid covering the electronic device but not being in physical contact with the acoustically active portion of the electronic device.

2. The package of claim 1 wherein each upper surface signal connector pad is electrically connected to a lower surface signal connector pad by means of conducting material located within a hole in the substantially non-conducting material of the lid, which hole connects the upper surface of the lid to the lower surface of the lid.

3. The package of claim 2 wherein the bonding strip on the upper surface of the die and the bonding strip on the lower surface of the lid are made of conducting material and are electrically connected by the bonding material, the lid further including a conducting strip on the upper surface of the lid that is electrically connected to the bonding strip on the lower surface of the lid by means of conducting material located within a hole in the substantially non-conducting material of the lid, which hole connects the upper surface of the lid to the lower surface of the lid.

4. The package of claim 3 in which the conducting strip on the upper surface of the lid and the bonding strip on the lower surface of the lid and the bonding strip on the upper surface of the die act as a signal ground.

5. The package of claim 4 in which the bonding strip on the upper surface of the die and the bonding strip on the lower surface of the lid completely surround the acoustically active portion of the electronic device and are bonded together so as to seal the electronic device hermetically.

6. The package of claim 3 in which the bonding strip on the upper surface of the die and the bonding strip on the lower surface of the lid completely surround the acoustically active portion of the electronic device and are bonded together so as to seal the electronic device hermetically.

7. The package of claim 2 in which the bonding strip on the upper surface of the die and the bonding strip on the lower surface of the lid completely surround the acoustically active portion of the electronic device and are bonded together so as to seal the electronic device hermetically.

8. The package of claim 1 wherein the bonding strip on the upper surface of the die and the bonding strip on the lower surface of the lid are made of conducting material and are electrically connected by the bonding material, the lid further including a conducting strip on the upper surface of the lid that is electrically connected to the bonding strip on the lower surface of the lid.

9. The package of claim 8 in which the conducting strip on the upper surface of the lid and the bonding strip on the lower surface of the lid and the bonding strip on the upper surface of the die act as a signal ground.

10. The package of claim 1 in which the bonding strip on the upper surface of the die and the bonding strip on the lower surface of the lid completely surround the acoustically active portion of the electronic device and are bonded together so as to seal the electronic device hermetically.

11. A chip-scale package for an electronic device of the type having an acoustically active portion comprising:

a die having an upper surface and having the electronic device located at the upper surface of the die and having a signal connector pad located upon the upper surface of the die and having a bonding strip located upon the upper surface of the die, a lid made of a substantially non-conducting material and having a lower surface and an upper surface and having a lower surface bonding strip and a lower surface signal connector pad located upon the lower surface of the lid and having an upper surface signal connector pad located upon the upper surface of the lid, the upper surface signal connector pad being electrically connected to the lower surface signal connector pad, the lower surface signal connector pad on the lid being electrically connected to the signal connector pad located upon the upper surface of the die, the bonding strip located upon the upper surface of the die being bonded by a bonding material to the bonding strip located upon the lower surface of the lid, the lid covering the electronic device but not being in physical contact with the acoustically active portion of the electronic device, wherein the bonding strip on the upper surface of the die and the bonding strip of the lid are electrically conductive, the lid further including a conducting strip on the upper surface of the lid that is electrically connected to the bonding strip on the lower surface of the lid.

12. The package of claim 11 in which the bonding strip on the upper surface of the die and the bonding strip on the lower surface of the lid completely surround the acoustically active portion of the electronic device and are bonded together so as to seal the electronic device hermetically.

* * * * *

(12) EX PARTE REEXAMINATION CERTIFICATE (7844th)
United States Patent
Lakin et al.

(10) Number: US 6,114,635 C1
(45) Certificate Issued: Nov. 2, 2010

(54) CHIP-SCALE ELECTRONIC COMPONENT PACKAGE

(75) Inventors: Kenneth Meade Lakin, Redmond, OR (US); Ralph Edward Rose, Bend, OR (US); Kevin Thomas McCarron, Bend, OR (US)

(73) Assignee: Triquint Semiconductor, Inc., Hillsboro, OR (US)

Reexamination Request:
No. 90/010,649, Aug. 18, 2009

Reexamination Certificate for:
Patent No.: 6,114,635
Issued: Sep. 5, 2000
Appl. No.: 09/115,131
Filed: Jul. 14, 1998

(51) Int. Cl.
    *H05K 1/16* (2006.01)

(52) U.S. Cl. .................. 174/260; 361/752; 361/753
(58) Field of Classification Search .............. None
    See application file for complete search history.

(56) References Cited

U.S. PATENT DOCUMENTS

| | | |
|---|---|---|
| 3,447,038 A | 5/1969 | Liben |
| 4,023,562 A | 5/1977 | Hynecek |
| 4,261,086 A | 4/1981 | Giachino |
| 4,293,986 A | 10/1981 | Kobayashi |
| 4,362,961 A | 12/1982 | Gerber |
| 4,409,567 A | 10/1983 | Setsune |
| 4,421,621 A | 12/1983 | Fujii |
| 4,639,631 A | 1/1987 | Chason |
| 4,639,698 A | 1/1987 | Nishiki |
| 4,734,608 A | 3/1988 | Takoshima |
| 4,905,075 A | 2/1990 | Temple |
| 4,914,741 A | 4/1990 | Brown |
| 4,972,253 A | 11/1990 | Palino |
| 5,023,398 A | 6/1991 | Mahulikar |
| 5,043,533 A | 8/1991 | Spielberger |
| 5,099,392 A | 3/1992 | Miller |
| 5,162,822 A | 11/1992 | Wakamori |
| 5,166,773 A | 11/1992 | Temple |
| 5,229,647 A | 7/1993 | Gnadinger |
| 5,235,135 A | 8/1993 | Knecht |
| 5,291,062 A | 3/1994 | Higgins |
| 5,313,371 A | 5/1994 | Knecht |
| 5,418,329 A | 5/1995 | Katoh |
| 5,448,014 A | 9/1995 | Kong |
| 5,459,368 A | 10/1995 | Onishi |
| 5,502,344 A | 3/1996 | Yoshimoto et al. |
| 5,506,463 A | 4/1996 | Yoshimoto et al. |
| 5,545,849 A | 8/1996 | Kondo |
| RE35,385 E | 12/1996 | Gloton |
| 5,596,243 A | 1/1997 | Tsuru |

(Continued)

FOREIGN PATENT DOCUMENTS

| | | |
|---|---|---|
| JP | 58138115 A | 8/1983 |
| JP | 4263508 A | 9/1992 |
| JP | 7066661 A | 3/1995 |
| JP | 7321594 A | 12/1995 |
| JP | H09-162690 | 6/1997 |

OTHER PUBLICATIONS

Esashi, "Encapsulated micro mechanical sensors," *Microsystem Technologies I,* 1994, pp. 2–9.

(Continued)

*Primary Examiner*—Minh T Nguyen (57) ABSTRACT

A chip-scale sized package for acoustic wave devices, acoustic resonators and similar acoustic devices located upon, or fabricated upon, or as part of, a die. The package includes a lid that is bonded to the die by a strip of solder or other bonding material so as to leave a space between the lid and that portion of the die that acoustically deforms or vibrates. The upper surface of the lid includes electrical connectors that are electrically connected via plated through holes or other means to electrical connectors, or pads on the lower surface of the lid, which pads, in turn, are electrically connected by solder or other electrically conducting material to electrical connectors to the device that are located upon the surface of the die.

U.S. PATENT DOCUMENTS

| | | | |
|---|---|---|---|
| 5,611,129 | A | 3/1997 | Yoshimoto et al. |
| 5,723,904 | A | 3/1998 | Shiga |
| 5,744,898 | A | 4/1998 | Smith |
| 5,745,986 | A | 5/1998 | Variot |
| 5,798,556 | A | 8/1998 | Hughes |
| 5,808,872 | A | 9/1998 | Ozawa |
| 5,827,999 | A | 10/1998 | McMillan |
| 5,880,553 | A | 3/1999 | Okeshi |
| 5,939,772 | A | 8/1999 | Hurst |
| 5,950,073 | A | 9/1999 | Griffin |
| 5,952,898 | A | 9/1999 | Nakata |
| 5,973,590 | A | 10/1999 | Kurtz |
| 6,037,698 | A | 3/2000 | Ueda |
| 6,051,907 | A | 4/2000 | Ylilammi |
| 6,054,767 | A | 4/2000 | Chia et al. |
| 6,087,759 | A | 7/2000 | Pfeil |
| 6,114,191 | A | 9/2000 | Young |
| 6,119,920 | A | 9/2000 | Guthrie |
| 6,130,483 | A | 10/2000 | Shizuki |
| 6,225,696 | B1 | 5/2001 | Hathaway |
| 6,242,842 | B1 | 6/2001 | Pahl |
| 6,262,637 | B1 | 7/2001 | Bradley et al. |
| 6,350,951 | B1 | 2/2002 | Askew |
| 6,377,137 | B1 | 4/2002 | Ruby |
| 6,812,619 | B1 | 11/2004 | Kaitila et al. |
| 6,841,922 | B2 | 1/2005 | Aigner et al. |
| 6,864,619 | B2 | 3/2005 | Aigner et al. |
| 6,909,340 | B2 | 6/2005 | Aigner et al. |
| 6,933,807 | B2 | 8/2005 | Marksteiner et al. |
| 7,268,436 | B2 | 9/2007 | Aigner et al. |
| 7,365,619 | B2 | 4/2008 | Aigner et al. |

OTHER PUBLICATIONS

Esashi, "Sensor Packaging," in *Micro System Technologies 90, 1 st Int'l Conf. on Micro Electro, Opto, Mechanic Systems and Components* (Reichl, ed., Berlin 1990) pp. 495–502.

Esashi, et al., "Anodic Bonding for Integrated Capacitive Sensors," *Micro Electro Mechanical Systems,* Germany, Feb. 4–7, 1992, pp. 43–48.

Esashi, et al., "Absolute Pressure Sensors by Air–tight Electrical Feedthrough Structure," *Sensors and Actuators, A21–A23,* 1990, pp. 1048–1052.

Fattinger, et al., "BAW PCS—Duplexer Chipset and Duplexer Applications," *TriQuint Semiconductor, Inc.,* Apopka, FL, Nov. 2, 2008, 5 pages.

Honma, et al., "Free–Down Bonding with Sealed Cavity for Micromechanical Device Packaging," *Sensors and Materials,* vol. 8, No. 1, 1996, pp. 23–31.

Yoshimi, et al., "Packaging of Resonant Sensors," *Technical Digest of the 11$^{th}$ Sensor Symposium,* 1992, pp. 35–38.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3-6, 8-9 and 11-12 is confirmed.

Claims 1, 2, 7 and 10 are cancelled.

* * * * *

(12) EX PARTE REEXAMINATION CERTIFICATE (8724th)
United States Patent
Lakin et al.

(10) Number: US 6,114,635 C2
(45) Certificate Issued: Nov. 29, 2011

(54) CHIP-SCALE ELECTRONIC COMPONENT PACKAGE

(75) Inventors: Kenneth Meade Lakin, Redmond, OR (US); Ralph Edward Rose, Bend, OR (US); Kevin Thomas McCarron, Bend, OR (US)

(73) Assignee: Triquint Semiconductor, Inc., Hillsboro, OR (US)

Reexamination Request:
No. 90/011,339, Nov. 18, 2010

Reexamination Certificate for:
Patent No.: 6,114,635
Issued: Sep. 5, 2000
Appl. No.: 09/115,131
Filed: Jul. 14, 1998

Reexamination Certificate C1 6,114,635 issued Nov. 2, 2010

(51) Int. Cl.
*H05K 1/16* (2006.01)

(52) U.S. Cl. .......................... 174/260; 361/752; 361/753

(58) Field of Classification Search ................... 174/260
See application file for complete search history.

(56) References Cited

To view the complete listing of prior art documents cited during the proceeding for Reexamination Control Number 90/011,339, please refer to the USPTO's public Patent Application Information Retrieval (PAIR) system under the Display References tab.

*Primary Examiner* — Minh T Nguyen (57) ABSTRACT

A chip-scale sized package for acoustic wave devices, acoustic resonators and similar acoustic devices located upon, or fabricated upon, or as part of, a die. The package includes a lid that is bonded to the die by a strip of solder or other bonding material so as to leave a space between the lid and that portion of the die that acoustically deforms or vibrates. The upper surface of the lid includes electrical connectors that are electrically connected via plated through holes or other means to electrical connectors, or pads on the lower surface of the lid, which pads, in turn, are electrically connected by solder or other electrically conducting material to electrical connectors to the device that are located upon the surface of the die.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 3-6, 8-9 and 11-12 is confirmed.

Claims 1-2, 7 and 10 were previously cancelled.

New claims 13-28 are added and determined to be patentable.

*13. The package of claim 3, wherein the bonding material is a gold/tin alloy.*

*14. The package of claim 3, wherein each upper surface signal connector pad is electrically connected to a respective one of the lower surface signal connector pads by lined holes.*

*15. The package of claim 3, wherein each upper surface signal connector pad is electrically connected to a respective one of the lower surface signal connector pads by filled holes.*

*16. The package of claim 3, wherein at least one of the upper surface signal connector pads extends to an edge of the lid.*

*17. The package of claim 16, wherein the conducting strip on the upper surface of the lid extends to an edge of the lid.*

*18. The package of claim 3, wherein the conducting strip on the upper surface of the lid extends to an edge of the lid.*

*19. The package of claim 3, wherein the conducting strip on the upper surface of the lid extends to two or more edges of the lid.*

*20. The package of claim 3, wherein the bonding strip located upon the upper surface of the die extends to one or more edges of the die.*

*21. The package of claim 11, wherein the bonding material is a gold/tin alloy.*

*22. The package of claim 11, wherein each upper surface signal connector pad is electrically connected to a respective one of the lower surface signal connector pads by lined holes.*

*23. The package of claim 11, wherein each upper surface signal connector pad is electrically connected to a respective one of the lower surface signal connector pads by filled holes.*

*24. The package of claim 11, wherein at least one of the upper surface signal connector pads extends to an edge of the lid.*

*25. The package of claim 24, wherein the conducting strip on the upper surface of the lid extends to an edge of the lid.*

*26. The package of claim 11, wherein the conducting strip on the upper surface of the lid extends to an edge of the lid.*

*27. The package of claim 11, wherein the conducting strip on the upper surface of the lid extends two or more edges of the lid.*

*28. The package of claim 11, wherein the bonding strip located upon the upper surface of the die extends to one or more edges of the die.*

\* \* \* \* \*